United States Patent
Feiweier

(10) Patent No.: US 10,006,979 B2
(45) Date of Patent: Jun. 26, 2018

(54) METHOD, CONTROLLER, AND MAGNETIC RESONANCE APPARATUS FOR MODEL-FREE DETERMINATION OF IMAGE REGIONS WITH ANOMALOUS DIFFUSION USING DIFFUSION-WEIGHTED MAGNETIC RESONANCE IMAGE DATA

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

(*) Notice: Subject to any disclaimer, the term of this patent is extended or adjusted under 35 U.S.C. 154(b) by 0 days. days.

(21) Appl. No.: 15/433,190

(22) Filed: Feb. 15, 2017

(65) Prior Publication Data
US 2017/0234956 A1    Aug. 17, 2017

(30) Foreign Application Priority Data
Feb. 15, 2016    (DE) .................. 10 2016 202 254

(51) Int. Cl.
G01V 3/00 (2006.01)
G01R 33/563 (2006.01)
G01R 33/56 (2006.01)

(52) U.S. Cl.
CPC ... G01R 33/56341 (2013.01); G01R 33/5608 (2013.01)

(58) Field of Classification Search
CPC .............................................. G01R 33/56341
USPC ................................................ 324/309, 307
See application file for complete search history.

(56) References Cited

U.S. PATENT DOCUMENTS

| | | | |
|---|---|---|---|
| 9,494,669 B2* | 11/2016 | Song | G01R 33/56341 |
| 9,568,580 B2* | 2/2017 | Dale | G01R 33/56341 |
| 2010/0298692 A1 | 11/2010 | Schmainda et al. | |
| 2011/0085722 A1 | 4/2011 | Feiweier | |
| 2012/0095700 A1 | 4/2012 | Novikov et al. | |
| 2013/0278257 A1 | 10/2013 | Boada et al. | |
| 2014/0091797 A1 | 4/2014 | Feiweier | |

(Continued)

FOREIGN PATENT DOCUMENTS

| CA | 2 854 844 A1 | 12/2015 |
|---|---|---|
| DE | 10 2009 049 402 A1 | 5/2011 |

OTHER PUBLICATIONS

Tuch, "Q-Ball Imaging," Magnetic Resonance in Medicine, vol. 52, pp. 1358-1372 (2004).

(Continued)

Primary Examiner — Louis Arana
(74) Attorney, Agent, or Firm — Schiff Hardin LLP

(57) ABSTRACT

In a magnetic resonance apparatus and a method and controller for operating such an apparatus, first and second diffusion-weighted image data are reconstructed from first and second diffusion-encoded raw data that were respectively acquired using different diffusion-encoding gradient pulse sub-sequences. The different sub-sequences differ by respectively having a different parameter that characterizes the respective sub-sequence as a function of time. The first and second reconstructed image data are compared and a deviation of the image data from normal Gaussian diffusion behavior is determined model-free on the basis of the comparison result.

14 Claims, 6 Drawing Sheets

(56) References Cited

U.S. PATENT DOCUMENTS

2014/0314298 A1    10/2014   Fieremans et al.
2016/0018504 A1    1/2016   Magin et al.

OTHER PUBLICATIONS

Parsons et al., "Temporal Diffusion Spectroscopy: Theory and Implementation in Restricted Systems Using Oscillating Gradients," Magnetic Resonance in Medicine, vol. 55, pp. 75-84 (2006).

Gore et al., "Characterization of Tissue Structure at Varying Length Scales Using Temporal Diffusion Spectroscopy," NMR Biomed., vol. 23, pp. 745-756 (2010).

Van et al., "In Vivo Investigation of Restricted Diffusion in the Human Brain with Optimized Oscillating Diffusion Gradient Encoding," Magnetic Resonance in Medicine, vol. 71, pp. 83-94 (2014).

Sigmund et al., "Time-dependent diffusion in skeletal muscle with the random permeable barrier model (RPBM): Application to normal controls and chronic exertional compartment syndrome patients," NMR Biomed., vol. 27, No. 5, pp. 519-528 (2014).

\* cited by examiner

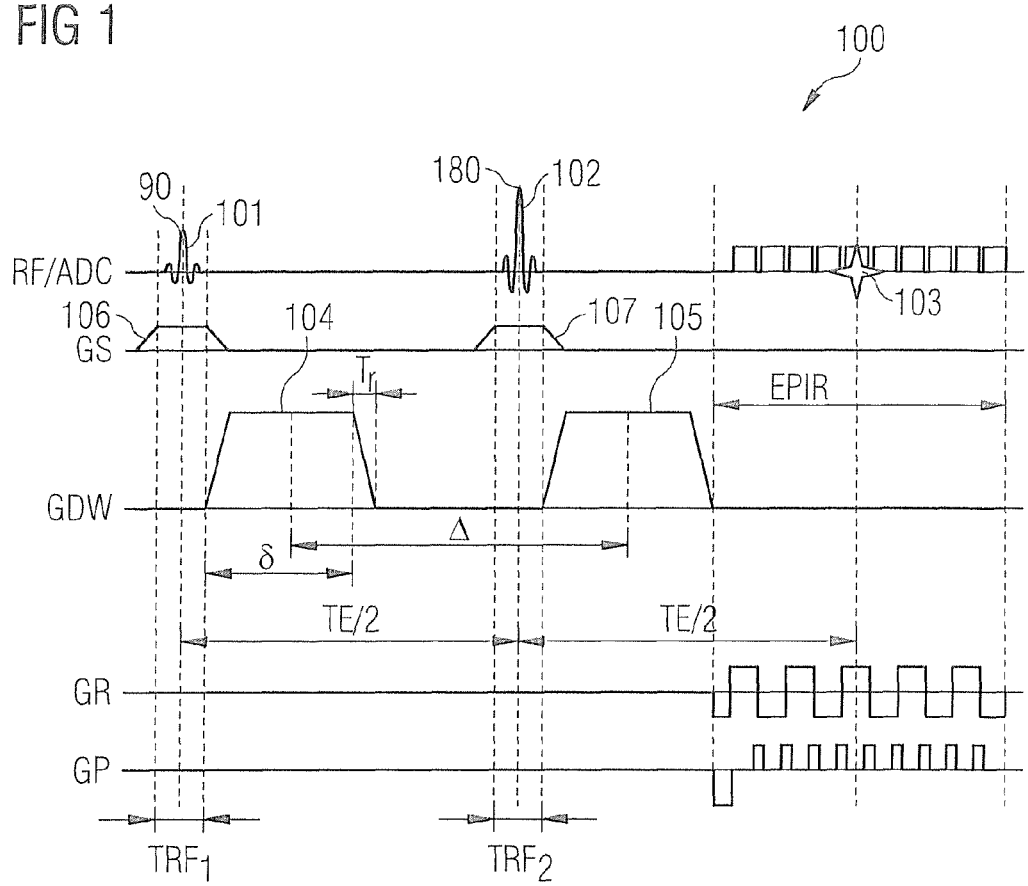

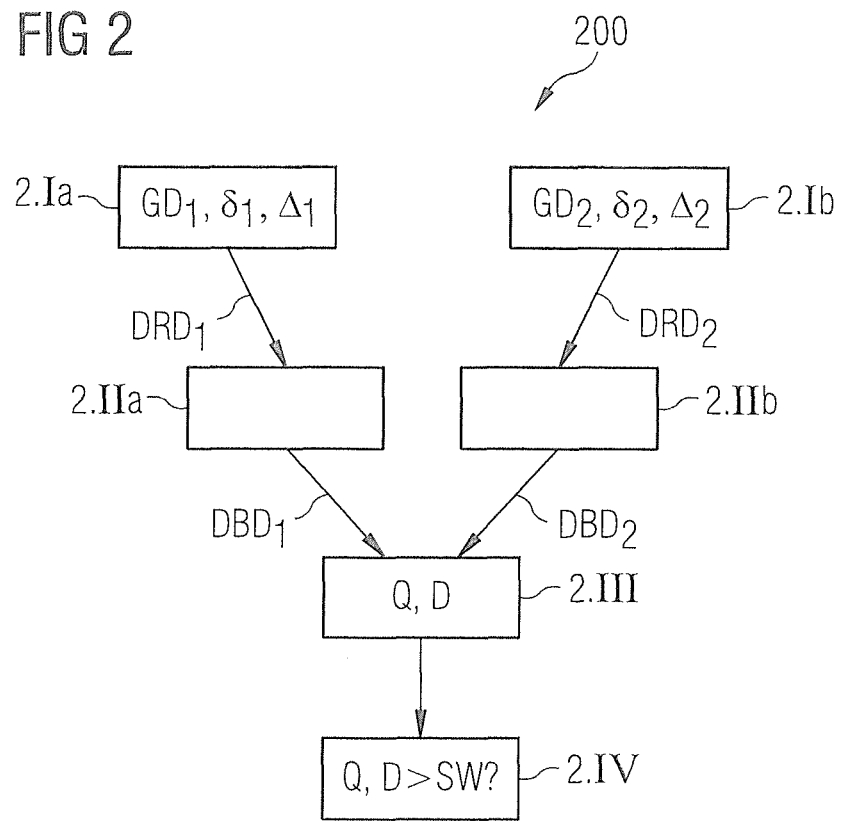
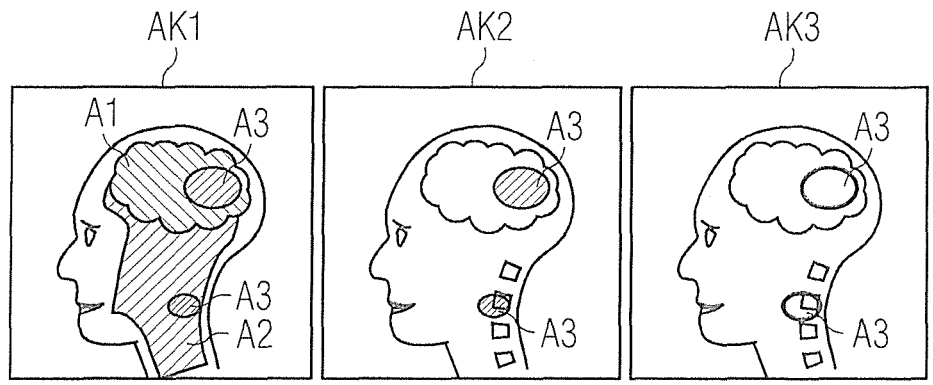

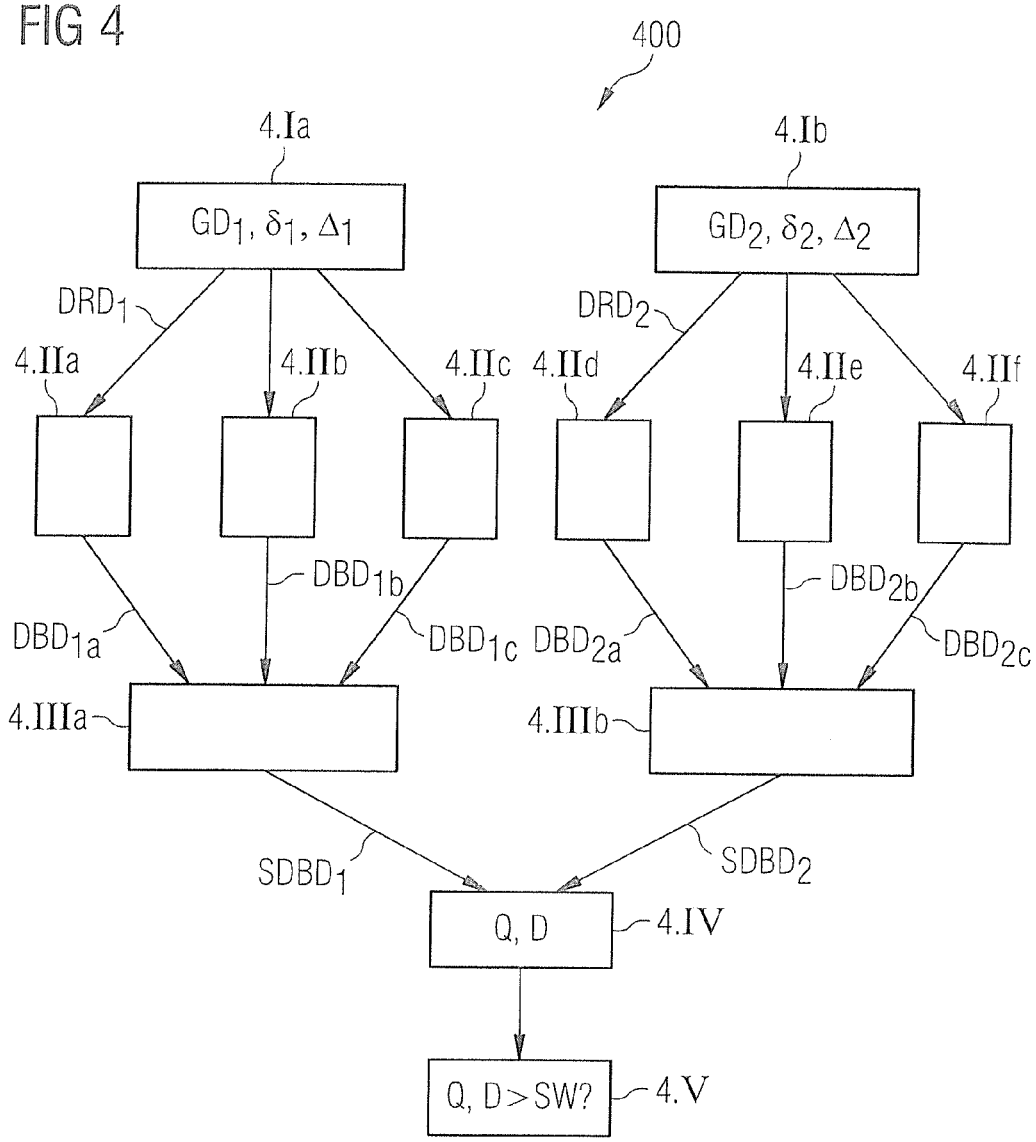

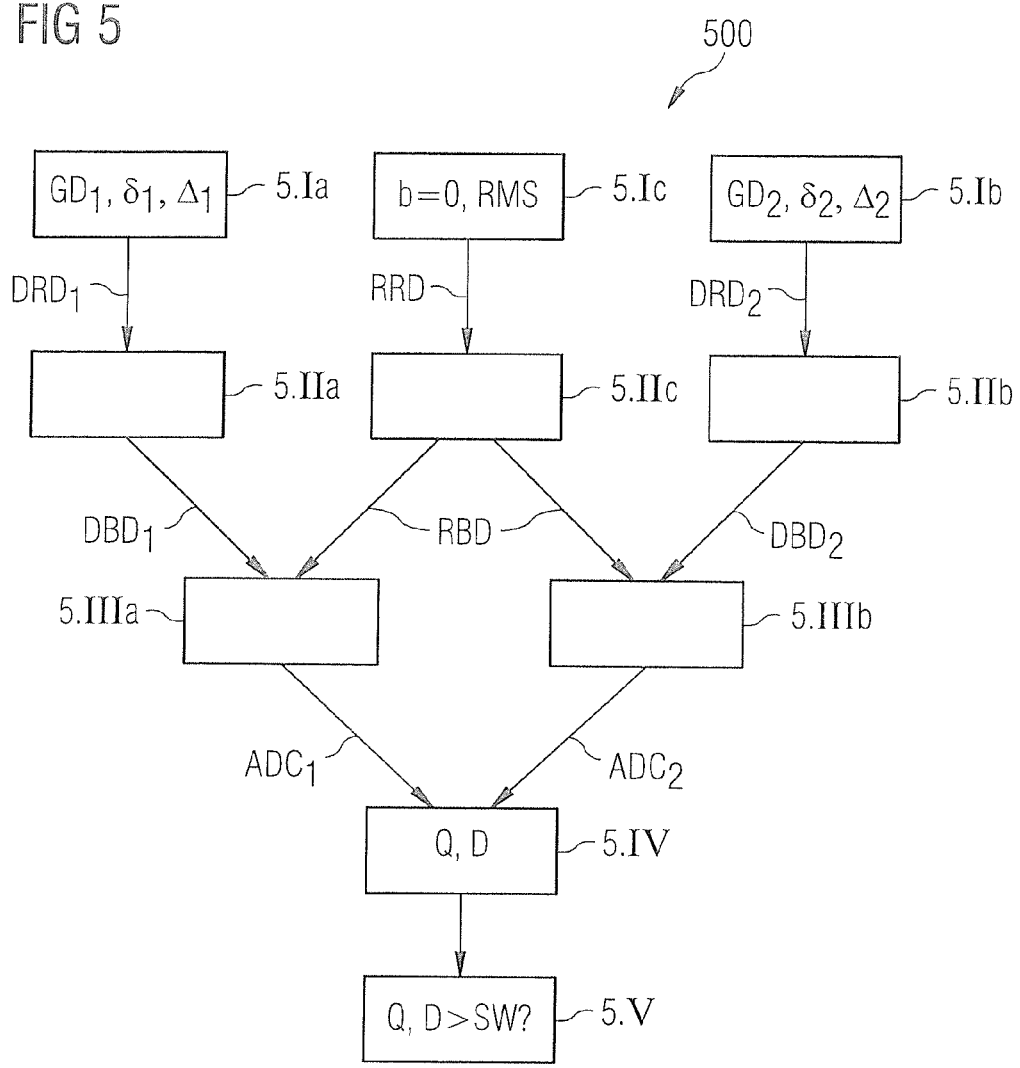

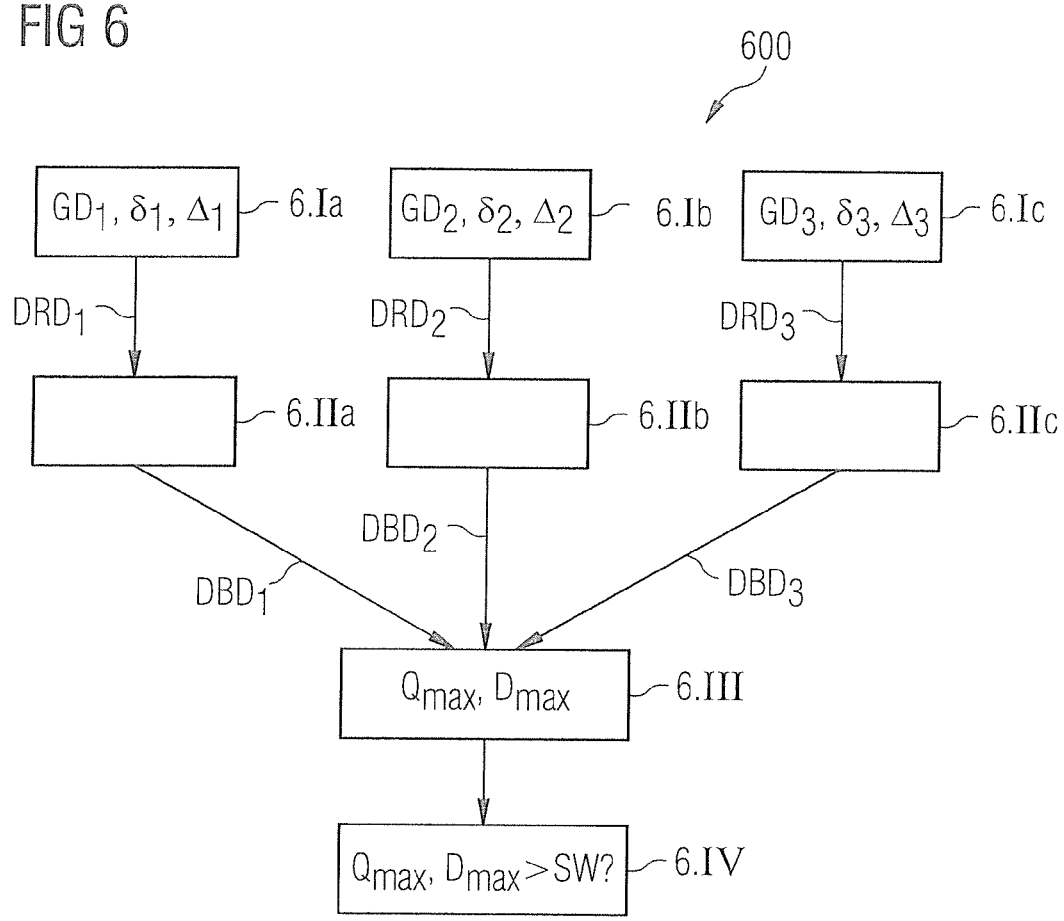

METHOD, CONTROLLER, AND MAGNETIC RESONANCE APPARATUS FOR MODEL-FREE DETERMINATION OF IMAGE REGIONS WITH ANOMALOUS DIFFUSION USING DIFFUSION-WEIGHTED MAGNETIC RESONANCE IMAGE DATA

BACKGROUND OF THE INVENTION

Field of the Invention

The invention concerns a method for determining a deviation of diffusion-weighted magnetic resonance image data of an examination object from normal diffusion behavior. The invention also concerns a method for producing an anomaly map or a normality map of a field of a view of an examination object. The invention also concerns a controller for a magnetic resonance system, a magnetic resonance system, and a non-transitory, computer-readable storage medium encoded with programming instructions, for implementing such methods.

Description of the Prior Art

"Magnetic resonance scans" as used herein mean data generated from raw data acquired from the inside of the examination object with the use of a magnetic resonance scanner controlled within the scope of the method, as well as parameter maps that reproduce a spatial or temporal distribution of specific parameter values inside the examination object, and that can be generated from the raw data.

Diffusion-weighted magnetic resonance scans are magnetic resonance scans with which the diffusion movement of certain substances, in particular water molecules in the body tissue, can be scanned and be displayed in a spatially resolved manner. Diffusion imaging has become established in everyday clinical practice, in particular for diagnosing strokes, since the affected regions of the brain can already be seen much earlier in diffusion-weighted images than in conventional magnetic resonance scans. In addition, diffusion imaging is increasingly being used in the fields of oncological, cardiological and musculoskeletal diseases. One variant of diffusion-weighted magnetic resonance tomography is diffusion tensor imaging, in which the anisotropy of the diffusion is also detected. Diffusion-weighted magnetic resonance scans as used herein encompass magnetic resonance scans generated in the course of diffusion-weighted magnetic resonance tomography as well as magnetic resonance scans generated in the course of diffusion tensor imaging.

Diffusion-encoded raw data must first be acquired for generating diffusion-weighted magnetic resonance images. This is done using specific scanning sequences, which will hereinafter be called diffusion gradient scanning sequences. A characteristic of these scanning sequences is that after conventional tilting (flipping) of the spins into a plane perpendicular to the basic magnetic field of the magnetic resonance scanner, a specific sequence of gradient magnetic field pulses is switched that change the field strength of the scanner's magnetic field in a predefined direction. Where there is a diffusion movement, the precessing nuclei come out of phase, and this can be perceived in the scanning signal.

With diffusion imaging, a number of images having different diffusion directions and weightings, i.e. having different diffusion-encoding gradient pulses, are usually recorded and combined with each other. The strength of the diffusion weighting is usually defined by what is known as the diffusion weighting factor, also called the "b-value". The different diffusion images or the images combined therefrom, or parameter maps, can then be used for the desired diagnostic purposes. To be able to correctly estimate the effect of the diffusion movement, a further reference scan is used in many cases for comparison, in which no diffusion-encoding gradient pulse is activated, i.e. an image where b=0. The pulse-scanning sequence for acquisition of the reference raw data is constructed in the same way as the diffusion gradient scanning sequence, with the exception of transmission of the diffusion-encoding gradient pulses. Alternatively, a reference scan can be carried out with a b-value< >0.

Usually images or parameter maps are used in MR diffusion imaging for diagnosis, in which a free diffusion process, also called a free normal Gaussian diffusion process, having an apparent diffusion coefficient (ADC=apparent diffusion coefficient) is assumed. This process is characterized by the signal strength decreasing according to an exponential correlation as a function of the diffusion-weighting factor.

Extensions to this model take into account, for example, the anisotropy of diffusion in microscopically limited geometries: water molecules, for example, can move faster along nerve fibers than perpendicular thereto. The diffusion tensor model always detects these correlations under the assumption of an accordingly direction-dependent, free normal Gaussian diffusion process and allows the calculation and display of associated parameters or parameter values, such as, for example, parameters relating to directional anisotropy.

Furthermore, there is a range of further approaches with which deviations from the Gaussian behavior can be described with corresponding model functions. These include, for example, the IVIM-model (IVIM=Intra-Voxel Incoherent Motion) in which a bi-exponential decrease in the signal amplitude is assumed as a function of the b-value, due to perfusion effects. The Kurtosis model, in which deviations of the exponential dependency of the signal strength from the b-value are modeled with tensors of a higher order, also belong to this category of approaches.

Detection of a large number of diffusion directions and/or weightings enables a more accurate image of the local diffusion geometry to be obtained. A number of preferred directions can therefore be resolved within one image voxel with HARDI (High Angular Resolution Diffusion Imaging=diffusion imaging with high angular resolution), DSI (Diffusion Spectrum Imaging) or Q-Ball-methods (see David S. Tuch, "Q-Ball Imaging", Magnetic Resonance in Medicine 52:1358-1372 (2004)).

In addition, methods are known with which the dependency of the signal intensity is taken into account in the experiment not only by the b-value and the direction, but also by specific interval durations in order to draw conclusions about microscopic tissue parameters (e.g. the axon radius, the surface-to-volume ratios, etc.) using model assumptions.

The last-mentioned group of methods offers the possibility of generating new contrasts, based on the diffusion, having a potentially high clinical value. However, the assumptions underlying the models are usually highly simplified and the "parameter maps" based thereon dubious in respect of their validity.

SUMMARY OF THE INVENTION

An object of the present invention is to provide a method for determining a deviation of diffusion-weighted magnetic resonance image data of an examination object from normal diffusion behavior, as well as a controller for a magnetic resonance system that is suitable therefor, with which anomalous diffusion processes can be made visible and in which the artifacts that occur due to the described simplifying models are avoided.

Within the scope of the inventive method for determining a deviation of diffusion-weighted magnetic resonance image data of an examination object from normal diffusion behavior, first diffusion-encoded raw data are acquired by activation of a first diffusion-encoding gradient pulse sub-sequence. Furthermore, at least second diffusion-encoded raw data are acquired by activation of at least one second diffusion-encoding gradient pulse sub-sequence. During acquisition of the at least second diffusion-encoded raw data, the value of at least one of the parameters is changed, that parameter determining the characteristic as a function of time of the diffusion-encoding gradient pulse sub-sequence being used. The at least one parameter that is changed is thus of a type also called time parameters or time interval parameters for short. In other words, the second diffusion-encoding gradient pulse sub-sequence differs from the first diffusion-encoding gradient pulse sub-sequence with respect to its characteristic as a function of time. Changed time parameters can be, for example, the gradient duration $\delta$ or the interval $\Delta$ between the gradients or other parameters, such as additional pauses or changed gradient pulse forms or a changed frequency or oscillation frequency when applying oscillating gradient pulses. As can be seen in FIG. 1, RF excitation pulses and frequency-encoding and phase-encoding gradients for reading out are also required for detecting diffusion-encoded raw data. Since these gradients are conventionally switched, they will not be described in detail in this connection.

First diffusion-encoded image data are reconstructed on the basis of the first diffusion-encoded raw data and at least second diffusion-encoded image data are reconstructed on the basis of the at least second diffusion-encoded raw data. This occurs conventionally, for example using a Fourier transform of the raw data in the location space. Finally, a deviation from normal diffusion behavior is determined model-free on the basis of a comparison between the first and the at least second diffusion-encoded image data. A model-free determination in this context means that the reconstructed image data and the comparison are not based on a model, i.e., the reconstructed image data are not described by a mathematical model. Instead, a deviation of at least one of the first or second diffusion-encoded image data from normal, i.e. from Gaussian diffusion behavior, is quantitatively determined directly. Gaussian diffusion behavior in this context means diffusion behavior corresponding to a normally distributed Brownian motion.

Simple, model-free determination of a measure of the anomaly of the diffusion on the basis of scans having different interval durations of diffusion encoding is attained with the inventive method. A deviation of the diffusion behavior from normal diffusion behavior is therefore quantitatively determined. Due to the different interval durations, which affect, for example, the "observation time" of the diffusion process, the method is implicitly dependent on the microstructure of the tissue, whereby additional contrast information can be collated as a function of the tissue structure. Laborious and frequently error-prone analyses and data adjustments are dispensed with due to the decoupling of the method from microstructural diffusion models. In addition, the interval durations used during the acquisition of the raw data may be set so as to be region-specific, tissue-specific and/or pathology-specific, so that a desired contrast can be optimized.

In the inventive method for illustrating the distribution of the deviation from normal diffusion behavior in a field of view of an examination object, diffusion-weighted magnetic resonance image data of the field of view are generated, preferably with the use of the described inventive method for determining a deviation of diffusion-weighted magnetic resonance image data of an examination object from normal diffusion behavior. A visual illustration of the field of views is then generated which illustrates the spatial distribution of the deviation from normal diffusion behavior. The regions in which a diffusion anomaly was determined can then advantageously be concentrated on in more detail. An anomaly of this kind can be an indication of a presence of a change in tissue, such as a tumor.

An inventive controller for a magnetic resonance system has a radio-frequency transmitter for transmitting radio-frequency pulses to an RF transmitting antenna system of a scanner of the magnetic resonance system, and a gradient system interface for controlling a gradient system of the magnetic resonance scanner. Furthermore, the inventive controller has a radio-frequency receiver for receiving raw data from an RF receiving antenna system of the magnetic resonance scanner, and a sequence controller that sends sequence control data to the radio-frequency transmitter, the gradient system interface and the radio-frequency receiver in order to implement magnetic resonance scans of an examination object during operation, so that diffusion-encoded raw data are acquired by the use of a diffusion gradient scanning sequence. The diffusion gradient scanning sequence has at least the following steps:

acquisition of first diffusion-encoded raw data by activation of a first diffusion-encoding gradient pulse sub-sequence, acquisition of at least second diffusion-encoded raw data by activation of at least a second diffusion-encoding gradient pulse sub-sequence, wherein the value of at least one of the parameters that determines the characteristic as a function of time of the respective diffusion-encoding gradient pulse sub-sequence is changed during acquisition of the at least second diffusion-encoded raw data.

Part of the inventive controller is, moreover, an image reconstruction processor for the reconstruction of first diffusion-encoded image data on the basis of the first diffusion-encoded raw data and at least second diffusion-encoded image data on the basis of the at least second diffusion-encoded raw data. The inventive controller also has a comparator that determines a deviation from normal diffusion behavior on the basis of a comparison between the first and the at least second diffusion-encoded image data.

Apart from a basic field magnet, with which a basic field magnetic field is conventionally applied in the patient-scanning space, the inventive magnetic resonance apparatus must have a transmitting antenna system as described above, a gradient system having a number of gradient coils, a receiving antenna system, and the inventive controller as described above.

The sequence controller, image reconstruction processor and comparator of the inventive controller are preferably implemented in the form of software in a suitable programmable controller having appropriate storage capacity. The radio-frequency transmitter, gradient system interface and radio-frequency receiver can also be at least partially implemented in the form of software units, with other units of these components in turn being pure hardware units, for example the radio-frequency amplifier, radio-frequency transmitter, gradient pulse-generating device of the gradient system interface, or an analog/digital converter of the radio-frequency receiver, etc. An implementation largely in terms of software, in particular of such units, has the advantage that controllers currently in use can be easily upgraded by a software update in order to operate inventively.

Accordingly, the present invention also encompasses a non-transitory, computer-readable data storage medium encoded with programming instructions that, when the storage medium is loaded into a memory of a programmable magnetic resonance system controller, cause the controller to operate the magnetic resonance systems so as to execute any or all embodiments of the method according to the invention, as described above and below.

Apart from the computer program, a computer program product of this kind can optionally comprise additional components, such as, e.g. documentation and/or additional components, also hardware components, such as, e.g. hardware keys (dongles, etc.) for utilization of the software.

The computer-readable storage medium can be, for example, a memory stick, a hard disk, a dongle, or another transportable or permanently installed data carrier, from which the program code can be read and executed by the controller. The embodiments and advantages of each aspect of the invention apply analogously to the other aspects. Furthermore, the various features of different exemplary embodiments can be combined within the scope of the invention to form further exemplary embodiments.

In a preferred embodiment of the method, the comparison includes the formation of a comparative value on the basis of the image intensities of the first and the at least second image data, and the deviation from normal diffusion behavior is determined as a function of the size of the value of this comparative value. The image intensities, also called signal intensities, correspond to the signal strength that, in the image reconstruction, is associated with an image point, e.g. a voxel or pixel. These can be represented in an image representation, for example, by gray scales. A spatially-dependent value that identifies the deviation from normal diffusion behavior is therefore determined, with a greater deviation value exhibiting a greater deviation from normal diffusion behavior, and vice versa.

The comparative value preferably is a difference in the image intensities of the first and at least second image data. A particularly simple formation of the comparative value of this type can be implemented, for example, with a variant of the inventive method in which a b-value approximately identical to that in the acquisition of the first diffusion-encoded raw data is used for acquisition of the second diffusion-encoded raw data. "Approximately identical" in this context means that the b-values used in the acquisition of the first and second diffusion-encoded raw data do not differ from each other by more than 1%. In this variant a value "0" of the comparative value means that there is normal diffusion at the relevant position. The greater the absolute value of the comparative value, the more the diffusion behavior at the relevant position differs from normal diffusion behavior.

Alternatively, the comparative value can be a quotient of the image intensities of the first and the at least second image data. If the value of the comparative value is "1" at one position, then this means that there is normal diffusion at the relevant position. If the value of the comparative value differs from "1" at a position, it may be concluded that there is an anomalous diffusion at this position. In this way a measure of a deviation from normal diffusion behavior is defined, without model considerations being necessary for this purpose. This variant for forming the comparative value can also be implemented when a b-value approximately identical to that in the acquisition of the first diffusion-encoded raw data is used in the acquisition of the second diffusion-encoded raw data.

In a further embodiment of the inventive method, the first and the at least second diffusion-encoded image data represent information with respect to the diffusion in a single defined direction of the diffusion gradient. This is the case, for example, if the comparative value results directly from the difference in the image intensities of the first and at least second image data.

If the b-values deviate significantly from each other during scanning of the first and second diffusion-encoded raw data, or if different diffusion directions are taken into account, first and at least second parameters that can be derived from a diffusion tensor model are determined on the basis of the first and at least second reconstructed diffusion-encoded image data. A deviation from normal diffusion behavior is then determined on the basis of a comparison between the first and at least second parameters. "Derived from a diffusion tensor model" in this context means that the first and second parameters can be determined from a diffusion tensor. However, these parameters can also be determined in another way, for example, on the basis of image data diffusion-weighted in only one direction (for example, when determining a direction-specific apparent diffusion coefficient ADC as the parameter) or on the basis of image data diffusion-weighted in only three directions (for example, when determining diffusion coefficients derived from track-weighted images). These parameters can be determined without a complete diffusion tensor having been determined in advance.

In addition, the reference raw data can be acquired by a reference scanning sequence in the inventive method. This procedure is necessary if the second diffusion-encoded raw data was acquired with a different b-value from the b-value that was used in the acquisition of the first diffusion-encoded raw data. In this case a first parameter that can be derived from a diffusion tensor model is determined on the basis of the first diffusion-encoded raw data and the acquired reference raw data, and an at least second parameter that can be derived from the diffusion tensor model is determined on the basis of the at least second diffusion-encoded raw data and the acquired reference raw data. The comparison step can then be configured such that a comparative value is determined on the basis of the first and second parameters that can be derived from the diffusion tensor model. The comparative value can in turn be determined, for example, from a difference or a quotient from the first and second parameters that can be derived from the diffusion tensor model.

Different raw data having different b-values, also deviating from b=0, can also be acquired as reference raw data for determining the first and at least second parameters that can be derived from the diffusion tensor model.

The same reference raw data can be used for determining the first and at least second parameters that can be derived from the diffusion tensor model in an expedient manner only if its b-value has the value zero (in this case the diffusion-encoding gradients are zero and therefore the different interval durations are insignificant).

If the reference raw data have a significant diffusion weighting (i.e. b< >0), then a separate reference scan (having the respectively associated interval durations) is carried out for each of the two recordings of diffusion-weighted raw data, the time response of which scan corresponds to the different time parameter values which are associated with the respective sub-sequences for acquisition of the first or at least second diffusion-encoded raw data.

In an embodiment of the inventive method, the first and at least second parameters are one of the following types of parameter:
apparent diffusion coefficient ADC,
fractional anisotropy FA,
relative anisotropy RA,
volume ratio VV,
linearity LN,
planarity PL,
sphericity SP.

The apparent diffusion coefficient as used herein means the diffusion coefficient that results on the basis of the image intensities assuming a normal diffusion.

In this variant of the inventive method, first the tensor parameters are determined independently of each other on the basis of scans recorded with different time parameters. Deviations of the determined parameter values from each other then in turn represent a measure of the anomaly of the diffusion behavior.

Starting from the three eigenvalues e1, e2, e3 of the diffusion tensor DT, which are sorted according to e1>=e2>=e3, the parameters stated above are obtained according to:

$$ADC = \frac{e1 + e2 + e3}{3},$$

$$FA = \sqrt{\frac{1}{2} \cdot \frac{\sqrt{(e1-e2)^2 + (e2-e3)^2 + (e3-e1)^2}}{\sqrt{e1^2 + e2^2 + e3^2}}},$$

$$RA = \frac{\sqrt{(e1-e2)^2 + (e2-e3)^2 + (e3-e1)^2}}{e1 + e2 + e3},$$

$$VR = \frac{e1 \cdot e2 \cdot e3}{ADC^3},$$

$$LN = \frac{e1 - e2}{e1 + e2 + e3},$$

$$PN = 2 \cdot \frac{e2 - e3}{e1 + e2 + e3},$$

$$SP = 3 \cdot \frac{e3}{e1 + e2 + e3}.$$

Further parameters and parameter maps that can be derived from the eigenvalues and eigenvectors of the diffusion tensor are also known to those skilled in the art.

In another embodiment of the inventive method, track-weighted image data with information in number of diffusion in a plurality of directions, preferably in three defined directions, can be determined on the basis of the diffusion-encoded image data. The track-weighted image data are a measure of the diffusion behavior averaged over various directions. The track-weighted image data can then be used to determine comparative values to determine a measure of an anomaly of diffusion behavior.

It will be explained once again in more detail below which parameters can be derived on the basis of which scans (=acquisition of raw data with the use of diffusion-encoding gradient pulse sub-sequences or reference scans):

1) No additional reference scan: applicable if b-values of the first and second scans are virtually identical (and b< >0); diffusion time intervals of the first and second scans are different:

a) the first scan is carried out weighted in a single direction, the second scan is carried out weighted in an identical direction, one diffusion-weighted image is reconstructed in each case, deviations from normal diffusion behavior are determined on the basis of the diffusion-weighted images;

b) the first scan is carried out weighted in at least three suitable directions, the second scan is carried out weighted in at least three suitable directions (the directions can differ from those of the first scan or be identical), one track-weighted image is reconstructed in each case (no tensor needs to be calculated with "suitable" directions, e.g. when using orthogonal directions), deviations from normal diffusion behavior are determined on the basis of the track-weighted images;

c) the first scan is carried out weighted in at least six suitable directions, the second scan is likewise carried out weighted in at least six suitable directions (these can differ from those of the first scan or be identical), non-scaled diffusion tensors are determined in each case on the basis of the scans diffusion-weighted in different directions, one tensor parameter is determined in each case, deviations from normal diffusion behavior are determined on the basis of the tensor parameters.

2) At least one additional reference scan: applicable if b-values (b< >0) of the first and second scan differ from each other (but also in the case of identical b-values); diffusion-time intervals of the first and second scan are different:

a) A reference scan having negligible diffusion weighting, i.e. b is roughly 0 (diffusion-time intervals are insignificant in the reference scan in this case):

i) the first scan is carried out weighted in a single direction, the second scan is carried out weighted in an identical direction, one direction-specific apparent diffusion coefficient $ADC_1$, $ADC_2$ is determined in each case on the basis of the first and second scans and the shared reference scan, deviations from normal diffusion behavior are determined on the basis of the determined apparent diffusion coefficient $ADC_1$, $ADC_2$;

ii) the first scan is carried out weighted in at least three suitable directions, the second scan is carried out weighted in at least three suitable directions (these can differ from those of the first scan or be identical), track-weighted images in each case are determined on the basis of the first and second scans, one direction-independent apparent diffusion coefficient $ADC_1$, $ADC_2$ is determined in each case on the basis of the track-weighted images of the first and second scans and the reference scan, deviations from normal diffusion behavior are determined on the basis of the determined direction-independent apparent diffusion coefficients $ADC_1$, $ADC_2$;

iii) the first scan is carried out weighted in at least six suitable directions, the second scan is carried out weighted in at least six suitable directions (these can differ from those of the first scan or be identical), one scaled diffusion tensor $DT_1$, $DT_2$ in each case is determined on the basis of diffusion-weighted image data of the first or second scan and the shared reference scan, using the respective diffusion tensor $DT_1$, $DT_2$ one tensor parameter $P_1$, $P_2$ is determined in each case, deviations from normal diffusion behavior are determined on the basis of the determined tensor parameters $P_1$, $P_2$;

b) Two reference scans where b< >0 (first reference scan having the time intervals of the first scan, second reference scan having the time intervals of the second scan):

i) the first scan is carried out weighted in one direction, the second scan is carried out weighted in an identical direction, one direction-specific apparent diffusion coefficient $ADC_1$, $ADC_2$ in each case is determined on the basis of the first or second scan and the respective reference scan, deviations from normal diffusion behavior are determined on the basis of the determined direction-dependent apparent diffusion coefficients $ADC_1$, $ADC_2$;

ii) the first scan is carried out weighted in at least three suitable directions, the second scan is carried out weighted in at least three suitable directions (these can differ from those of the first scan or be identical), a first track-weighted image is determined on the basis of the first scan and a second track-weighted image is determined on the basis of the second scan, one direction-independent apparent diffusion coefficient ADC in each case is determined on the basis of the diffusion-weighted images and the respective reference scan, deviations from normal diffusion behavior are determined on the basis of the determined apparent diffusion coefficients;

iii) the first scan is carried out weighted in at least six suitable directions, the second scan is likewise carried out weighted in at least six directions (these can differ from those of the first scan or be identical), one scaled diffusion tensor in each case is determined on the basis of the first or second scan and the respective reference scan, a tensor parameter is calculated in each case on the basis of the respective diffusion tensor, the deviations from normal diffusion behavior are determined on the basis of the determined tensor parameters.

To expand the database for determining the anomaly values at least third raw data can be recorded with or without diffusion weighting, in addition to the first and second raw data and the reference raw data. In this variant the parameters that can be derived from the diffusion tensor model are preferably determined using a regression method. Due to the broader database the sought parameters can be determined with increased accuracy and reliability.

In addition to the detailed statements above, the additional application of a regression method is expedient for all cases under 2.a and 2.b.

An application of said embodiment to case 2.a.i will be described by way of example below (applies analogously to the other cases under 2.a and 2.b):

2) At least one additional reference scan is carried out: this procedure is applicable if b-values (b< >0) of the first and second scans differ from each other (it can also be applied with identical b-values, however). The diffusion-time intervals of the first and second scan are different in this case.

a) A reference scan with negligible diffusion weighting (i.e. b is approximately 0) is carried out (diffusion-time intervals are insignificant in the reference scan in this case):

i) the first scan is carried out weighted in one direction, the second scan is carried out weighted in an identical direction, (1) at least one further third scan is carried out with the diffusion-time intervals of the first scan and b3< >0 and b3< >b1, one direction-specific apparent diffusion coefficient ADC per regression method is determined on the basis of the first scan, third scan and reference scan, a direction-specific apparent diffusion coefficient ADC is determined on the basis of the second scan and reference scan, deviations from normal diffusion behavior are determined on the basis of the two direction-specific apparent diffusion coefficients;

(2) at least one further third scan is carried out with the diffusion-time intervals of the second scan and b3< >0 and b3< >b2, one direction-specific apparent diffusion coefficient ADC per regression method is determined on the basis of the second scan and third scan and reference scan per regression method, a direction-specific apparent diffusion coefficient ADC is determined on the basis of the first scan and reference scan, deviations from normal diffusion behavior are determined on the basis of the two direction-specific apparent diffusion coefficients;

(3) at least two further third and fourth scans are carried out with the diffusion-time intervals of the first and second scans and b3< >0 and b4< >0 and b3 < > b1 and b4< >b2, one direction-specific apparent diffusion coefficient ADC per regression method is determined on the basis of the first scan, third scan and reference scan, one direction-specific apparent diffusion coefficient ADC per regression method is determined on the basis of the second scan, fourth scan and reference scan, the deviations from normal diffusion behavior are determined on the basis of the two direction-specific apparent diffusion coefficients.

If the parameter used during acquisition of the at least third raw data and that determines the characteristic as a function of time of the diffusion-encoding gradient pulse sub-sequence is changed compared to the parameters during recording of the first and second raw data, then model-free statistical parameters can be used as the comparative value. Instead of subtraction or division, model-free statistical parameters are determined here in order to describe an anomaly in the diffusion behavior. For example, a maximum difference or a maximum quotient from the scans having different time parameters can be chosen as the anomaly measure for each image point, for example a voxel or pixel. Alternatively, the standard deviation of the comparative values, which were determined on the basis of the different image data sets, which were recorded with different diffusion-encoding gradient pulse sub-sequences having different time parameters or time interval parameters, can also be determined as a measure of the anomaly of the diffusion behavior. Similarly, other parameters, such as, for example, ones that describe the breadth of the distribution of the determined comparative values, are also suitable as a measure of the anomaly of the diffusion behavior in each image point.

Alternatively, the anomaly of the diffusion behavior can be described with the use of a series expansion of a location-dependent variable that is dependent on the diffusion-encoded image data as a function of at least two time interval durations. A Taylor series or a Fourier series, for example, can be used for this purpose. This variable can be, for example, a local image intensity, a local image intensity of a diffusion-weighted image, a local apparent diffusion coefficient or a diffusion tensor parameter. The coefficients of the series expansion or combinations thereof can be used as a measure of the anomaly of the diffusion behavior. For example, all coefficients would have the value zero for a normal diffusion.

Instead of the variation in the time intervals $\delta$, $\Delta$ in the Stejskal-Tanner sequence shown in FIG. 1 other diffusion sequences with other variable interval durations can also be used. DE 10 2012 217992 A1 describes, for example, how the diffusion gradient duration $\delta$ and/or the interval $\Delta$ between diffusion gradients can be freely varied in a double-rephased spin-echo experiment. In another variant oscillating diffusion gradients are used in which, for example, the period duration, the form of the gradients and/or the number of periods can be varied.

In one variant of the method for illustrating the distribution of the deviation from normal diffusion behavior, sections of the region to be examined are identified in an image display of the region to be examined, in which sections a threshold value of a deviation from normal diffusion behavior is exceeded. Alternatively, sections, in which a threshold value of a deviation from normal diffusion behavior is not exceeded is identified in an image display of the region to be examined, whereby an illustration denoted as a normality map is generated in this connection. An anomaly map or a normality map of this kind can be overlaid, for example, on clinical routine images or standard diffusion images, enabling fast anatomical orientation. If the regions of the anomaly map in which the threshold value is exceeded are identified by contours, then an "anomaly contour" of this kind enables the visual limitation and highlighting of regions having a corresponding anomaly value or an anomaly value that exceeds the threshold value with simultaneously unrestricted illustration of the corresponding anatomy. Threshold values for the anomaly map can also be defined region-tissue- and/or pathology-specifically. A threshold value of this kind can also be adjusted interactively according to individual user preferences.

BRIEF DESCRIPTION OF THE DRAWINGS

FIG. 1 is a pulse graph for a sequence known as a Stejskal-Tanner sequence for diffusion-weighted imaging.

FIG. 2 is a flowchart of the basic steps of a method for determining a deviation of diffusion-weighted magnetic resonance image data of an examination object from normal diffusion behavior, according to an exemplary embodiment of the invention.

FIG. 3 shows anomaly maps in which regions are marked on an anatomy map in which an anomalous diffusion occurs.

FIG. 4 is a flowchart of the basic steps of a method for determining a deviation of diffusion-weighted magnetic resonance image data of an examination object from normal diffusion behavior, according to a second exemplary embodiment of the invention.

FIG. 5 is a flowchart of the basic steps of a method for determining a deviation of diffusion-weighted magnetic resonance image data of an examination object from normal diffusion behavior, according to a third exemplary embodiment of the invention.

FIG. 6 is a flowchart of the basic steps of a method for determining a deviation of diffusion-weighted magnetic resonance image data of an examination object from normal diffusion behavior, according to a fourth exemplary embodiment of the invention.

DESCRIPTION OF THE PREFERRED EMBODIMENTS

Figure 7:
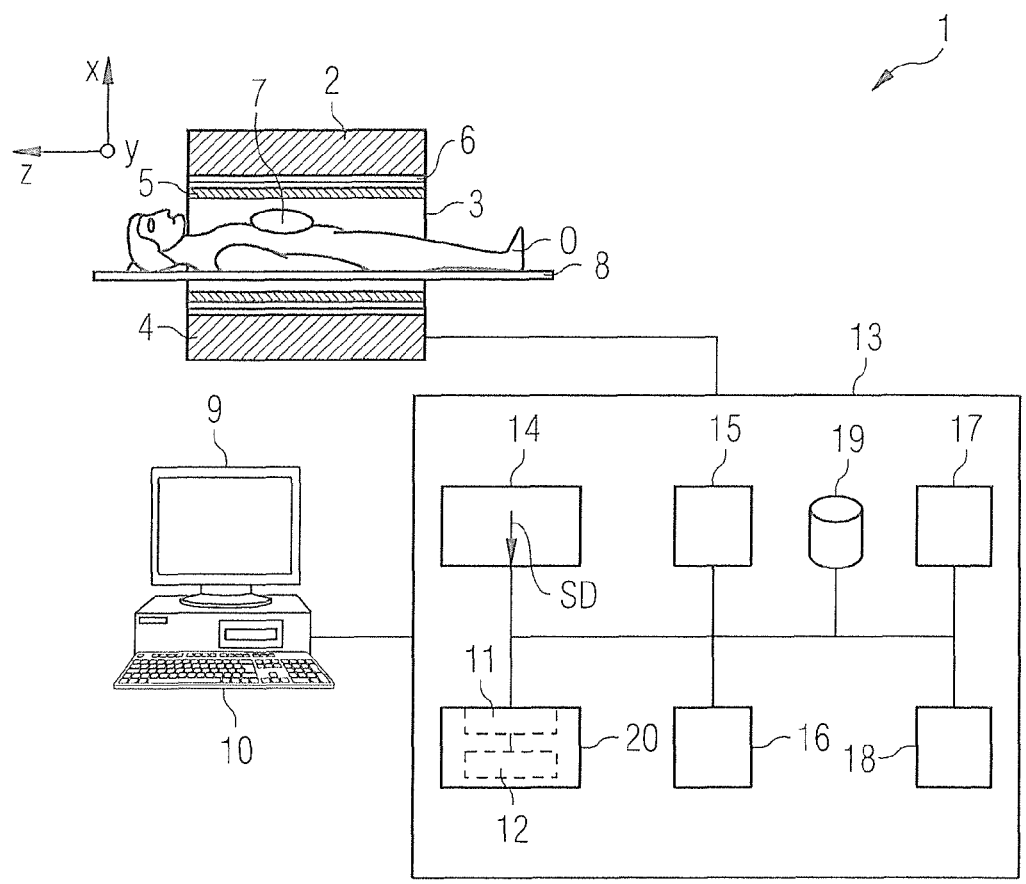
FIG. 7 is a block diagram of a magnetic resonance apparatus according to an exemplary embodiment of the invention.

FIG. 1 shows a Stejskal-Tanner sequence 100. This is by far the most important diffusion-weighted pulse sequence. The first line of the graph, which is identified by RF/ADC, shows an RF excitation pulse 101 having a duration $TRF_1$, which is radiated at the beginning of a pulse sequence at the same times as a slice selection gradient 106 (see second line GS), and an RF refocusing pulse 102 having a duration $TRF_2$, which is radiated between two diffusion contrast gradient pulses 104, 105 (see third line GDW) and with which a slice selection gradient 107 (see second line GS) is likewise switched at the same time. The gradient pulses 104, 105 have the same polarity and usually the same amplitude and duration. The RF refocusing pulse 102 forms a spin echo 103 (see first line) which in the illustrated example is read out with an EPI echo readout train EPIR, composed of multiple readout windows. Furthermore, the graph in FIG. 1 shows in the second line from the bottom a gradient pattern GR in the readout direction (frequency-encoding direction) and in the lowest line a gradient pattern GP in the phase encoding direction.

The echo time TE is the time between the HF excitation pulse 101 and the echo 103. The formation of the echoes results from the diminishing moment of all activated gradients along the three axes. The position of the refocusing pulse is preferably chosen at TE/2 in order to also compensate the moments generated by static magnetic field gradients that cannot be influenced (e.g. due to B0 inhomogeneities in the object) exactly at the echo instant.

The following is obtained for the b-value for the Stejskal-Tanner pattern shown in FIG. 1 having symmetrical, trapezoidal diffusion gradients 104, 105 with amplitude G and diminishing ramp time $T_r$:

$$b=4\pi^2\gamma^2 G^2[\delta^2(\Delta-\delta/3)]. \tag{1}$$

Here $\delta$ is the duration of a gradient and $\Delta$ is the time that elapses between activation on of the two gradient pulses 104, 105, i.e. the interval between those gradient pulses. The time intervals just defined are shown in FIG. 1. G is the gradient strength or gradient amplitude of the diffusion gradients 104, 105. The constant $\gamma$ indicates the gyromagnetic ratio. Only the contribution of the diffusion contrast gradients 104 and 105 for the b-value of the sequence is taken into account in formula 1. The strong diffusion contrast gradients 104, 105 of the Stejskal-Tanner sequence make the sequence sensitive to macroscopic movement as well as undirected molecular Brownian motion, since the signal from moved spins is dephased. Anomalies, which are caused by movements overlaid on the Brownian motions, therefore easily occur during image recording using a sequence of this kind.

FIG. 2 is a flowchart 200 for one possible scanning process in which the inventive method is used according to a first exemplary embodiment.

With this method, first diffusion-weighted raw data $DRD_1$ are acquired in step 2.Ia with a first pulse sequence having a first diffusion-encoding gradient pulse sub-sequence $GD_1$, as is shown in FIG. 1. The first diffusion-encoding gradient pulse sub-sequence $GD_1$ is characterized by time interval parameters $\delta$, $\Delta$, which were already described in connection with FIG. 1, having first parameter values $\delta_1$, $\Delta_1$. These first time interval parameter values $\delta_1$, $\Delta_1$ define the characteristic as a function of time of the first diffusion-encoding gradient pulse sub-sequence $GD_1$. A first b-value b1 is calculated from the first time interval parameter values $\delta_1$, $\Delta_1$ according to equation 1. In a step 2.Ib second diffusion-weighted raw data $DRD_2$ are additionally acquired with a second pulse sequence having a second diffusion-encoding gradient pulse sub-sequence $GD_2$. The second diffusion-encoding gradient pulse $GD_2$ is characterized by second time interval parameter values $\delta_2$, $\Delta_2$ which differ quantitatively from the first parameter values $\delta_1$, $\Delta_1$ at least with respect to one of the parameters $\delta$, $\Delta$. For example, $\delta_2 > \delta_1$. A second b-value b2 can be calculated from the second parameter values $\delta_2$, $\Delta_2$. The two b-values b1, b2 match or should at least approximately match in the first exemplary embodiment illustrated in FIG. 2, and this may always be achieved by suitable choice of the second diffusion-encoding gradient pulse sub-sequence $GD_2$.

In step 2.IIa first diffusion-encoded image data $DBD_1$ are then reconstructed on the basis of the acquired first diffusion-weighted raw data $DRD_1$. Conventional methods, such as a Fourier transform of the raw data in the image data space or the like, can be applied for this purpose. In step 2.IIb second image data $DBD_2$ are additionally reconstructed on the basis of the acquired second diffusion-weighted raw data $DRD_2$.

The image data are then compared image point-by-image point in step 2.III. In other words, the signal intensities $S_1$ of the first image data $DBD_1$ are compared with the signal intensities $S_2$ of the second image data $DBD_2$ for each image point. The comparison can include, for example, the formation of a quotient $Q=S_1/S_2$ or a difference $D=S_1\ S_2$. The extent of the existing anomaly or deviation from a Gaussian diffusion can then be determined, for example, using the extent of the deviation of the quotient Q from the value 1 or the deviation of the difference D from the value 0.

Finally, the results of the comparison are shown on a graph in step 2.IV. For example, regions in which a deviation or an anomaly exceeds a minimum are marked in color or with contours against the background of an image recorded without diffusion weighting. A threshold value SW, for example, can be defined for this purpose. The overlaying of masked or unmasked anomaly maps and clinical routine or diffusion images makes anatomical orientation possible for the user.

FIG. 3 shows images of this kind, also called "anomaly maps". An anomaly map is overlaid on an anatomic image in a left drawing AK1 of FIG. 3. Regions A1, A2, A3 with different hatching have varying degrees of anomalies, wherein denser hatching signifies a more pronounced anomaly. In the scenario shown in the left drawing AK1, regions A3 in the brain and in a portion of the neck have the most pronounced anomaly. A middle drawing AK2 of FIG. 3 shows the anomaly map by masking of sections A3 (shown in hatched lines) in which a threshold value SW of the anomaly is exceeded. Instead of planar marking, as is shown in the left drawing AK1 and the middle component drawing AK2 of FIG. 3, regions A3 with an anomaly extent above the threshold value can also be displayed as a contour in order to best illustrate the anatomical information of the clinical routine images in the relevant regions. The right drawing AK3 of FIG. 3 illustrates a procedure of this kind. An interactive adjustment of the threshold value allows the operator to match the display to his personal requirements. Pre-settings for tissue-specific, region-specific or pathology-specific threshold values can be taken from a database and used. Expedient threshold values can be determined from repeated scans with identical parameters: noise-induced (stochastic) variations can be separated from systematic diffusion anomalies thereby.

FIG. 4 is a flowchart 400 that illustrates a method for determining a deviation of diffusion-weighted magnetic resonance image data of an examination object from normal diffusion behavior according to a second exemplary embodiment of the invention. In the method illustrated in FIG. 4, which is based on the underlying structure of the method illustrated in FIG. 2 according to a first exemplary embodiment of the invention, track-weighted images each with three single images are generated instead of the simply diffusion-weighted images with a defined direction of the diffusion gradient. Analogously to step 2.Ia, first diffusion-weighted raw data $DRD_1$ are first acquired for this purpose in step 4.Ia, now albeit with three-dimensional diffusion weighting. In other words, the diffusion gradients are now preferably switched sequential, not just in the slice direction or z direction, but also in the in x and y directions, so that the diffusion movement is acquired along each of the three spatial dimensions. The diffusion-encoding gradient pulse sub-sequence $GD_1$ switched during recording of the first diffusion-weighted raw data $DRD_1$ is played with first time interval parameter values $\delta_1, \Delta_1$. A first b-value b1 correlates with the parameter values. Furthermore, second diffusion-weighted raw data $DRD_2$ is likewise acquired in step 4.Ib with a diffusion weighting in three different directions. The diffusion-encoding gradient pulse sub-sequence switched during recording of the second diffusion-weighted raw data $DRD_2$ is played with second time interval parameter values $\delta_2, \Delta_2$. A second b-value b2 correlates with the second time interval parameter values $\delta_2, \Delta_2$, and this approximately matches the first b-value b1 in the exemplary embodiment illustrated in FIG. 4.

Single images, i.e. a total of three diffusion-weighted single images, are then reconstructed in each case in steps 4.IIa, 4.IIb, 4.IIc based on first to third diffusion-weighted image data $DBD_{1a}$, $DBD_{1b}$, $DBD_{1c}$ on the basis of the first diffusion-weighted $DRD_1$. The first diffusion-weighted image data $DBD_{1a}$ represents the diffusion behavior in the z direction, the second diffusion-weighted image data $DBD_{1b}$ the diffusion behavior in the x direction and the third diffusion-weighted image data $DBD_{1c}$ the diffusion behavior in the y direction. Furthermore, single images, i.e. a total of three diffusion-weighted single images are then reconstructed in each case in steps 4.IId, 4.IIe, 4.IIf based on fourth to sixth diffusion-weighted image data $DBD_{2a}$, $DBD_{2b}$, $DBD_{2c}$ on the basis of the second diffusion-weighted raw data $DRD_2$. The fourth diffusion-weighted image data $DBD_{2a}$ represents the diffusion behavior in the z direction, the fifth diffusion-weighted image data $DBD_{2b}$ the diffusion behavior in the x direction and the third diffusion-weighted image data $DBD_{2c}$ the diffusion behavior in the y direction.

First track-weighted, diffusion-weighted image data $SDBD_1$ is then generated in step 4.IIIa on the basis of the first to third diffusion-weighted image data $DBD_{1a}$, $DBD_{1b}$, $DBD_{1c}$. If the first to third diffusion-weighted image data $DBD_{1a}$, $DBD_{1b}$, $DBD_{1c}$ match first to third image signal intensities $S_n(b1)$, the track-weighted image signal intensities $S_{Tr}(b1)$ for the first track-weighted, diffusion-weighted image data $SDBD_1$ result as $$S_{Tr}(b1) = S(b=0)e^{\frac{1}{N}\Sigma S_n(b1)} = S(b=0)e^{\frac{1}{N}\Sigma -b1Tr(DT)}. \quad (2)$$

The signal intensity $S(b=0)$ matches the intensity for the case where no diffusion gradient is switched. The designation DT stands in equation 2 for the diffusion tensor DT which contains information about the diffusion behavior at a location r in the space. Analogously to step 4.IIIa, second track-weighted, diffusion-weighted image data $SDBD_2$ is determined in step 4.IIIb on the basis of the fourth to sixth diffusion-weighted image data $DBD_{2a}$, $DBD_{2b}$, $DBD_{2c}$. If the fourth to sixth diffusion-weighted image data $DBD_{2a}$, $DBD_{2b}$, $DBD_{2c}$ matches fourth to sixth image signal intensities $S_n(b2)$, the track-weighted image signal intensities $S_{Tr}(b2)$ for the second track-weighted, diffusion-weighted image data $SDBD_2$ results as $$S_{Tr}(b2) = S(b=0)e^{\frac{1}{N}\Sigma S_n(b2)} = S(b=0)e^{\frac{1}{N}\Sigma -b2Tr(DT)}. \quad (3)$$

Finally, the image data is compared pixel-by-pixel in step 4.IV on the basis of the determined track-weighted image intensities $S_{Tr}(b1)$, $S_{Tr}(b2)$. In other words, the signal intensities $S_{Tr}(b1)$ of the first track-weighted, diffusion-weighted image data $SDBD_1$ are compared with the signal intensities $S_{Tr}(b2)$ of the second track-weighted, diffusion-weighted image data $SDBD_2$. The comparison can include, for example, the formation of a quotient $Q=S_{Tr}(b1)/S_{Tr}(b1)$ or a difference $D=S_{Tr}(b1) \ S_{Tr}(b2)$. The extent of the existing anomaly or the deviation from a Gaussian diffusion can then be determined, for example, with the use of how much the quotient Q differs from the value 1 or the difference D from the value 0.

Finally, the results of the comparison are shown in a graph in step 4.V. For example, regions in which a deviation or an anomaly exceeds a minimum are marked in color or with contours against the background of an image recorded without diffusion weighting. A threshold value SW, for example, can be defined for this purpose. The overlaying of masked or unmasked anomaly maps and clinical routine or diffusion images makes anatomical orientation possible for the user.

FIG. 5 is a flowchart 500 that illustrates a method for determining a deviation of diffusion-weighted magnetic resonance image data of an examination object from normal diffusion behavior according to a third exemplary embodiment of the invention. The exemplary embodiment shown in FIG. 5 differs from the exemplary embodiment shown in FIG. 2 to the extent that, in addition to the first and second raw data $DRD_1$, $DRD_2$, reference raw data RRD are also acquired, which are not diffusion-weighted. This is necessary if diffusion-encoding gradient pulse sub-sequences, whose b-values b1, b2 are significantly different, are activated for the acquisition of the first and second diffusion-weighted raw data $DRD_1$, $DRD_2$. The method can also be applied, however, with virtually identical b-values. The first diffusion-weighted raw data $DRD_1$ are then acquired in step 5.Ia analogously to the first exemplary embodiment with a first pulse sequence having a first diffusion-encoding gradient pulse sub-sequence $GD_1$ with first time interval parameter values $\delta_1$, $\Delta_1$ and a first b-value b1 again. Second diffusion-weighted raw data $DRD_2$ are additionally acquired in step 5.Ib with a second pulse sequence having a second diffusion-encoding gradient pulse sub-sequence $GD_2$ and second time interval parameter values $\delta_2$, $\Delta_2$, which differ quantitatively from the first time interval parameter values $\delta_1$, $\Delta_1$ at least in respect of one of said parameters $\delta$, $\Delta$. For example, $\delta_2 > \delta_1$. A second b-value b2 can be calculated from the second parameter values $\delta_2$, $\Delta_2$. In contrast to the first and second exemplary embodiments, the two b-values b1, b2 can then differ, as was discussed in connection with FIG. 2 and FIG. 4.

Raw data RRD without diffusion weighting, i.e. for b=0 or G=0, is also acquired in step 5.Ic with a reference scanning sequence RMS.

First diffusion-encoded image data $DBD_1$Bei are then reconstructed in step 5.IIa on the basis of the acquired first diffusion-weighted raw data $DRD_1$. Second image data $DBD_2$ are additionally reconstructed in a step 5.IIb on the basis of the acquired second diffusion-weighted raw data $DRD_2$. Furthermore, reference image data RBD are determined in step 5.IIc without diffusion weighting on the basis of the raw data RRD.

First diffusion coefficients $ADC_1$ are then determined in step 5.IIIa on the basis of the first diffusion-weighted raw data $DRD_1$ and the reference image data RBD. The first diffusion coefficients $ADC_1$ result as follows:

$$ADC_1 = -\frac{1}{b1} \cdot \ln\left(\frac{S(b1)}{S(b=0)}\right), \quad (4)$$

where $S(b1)$ are the signal intensities of the first diffusion-weighted image data $DBD_1$ and $S(b=0)$ are the signal intensities of the reference image data RBD.

Furthermore, second diffusion coefficients $ADC_2$ are determined in step 5.IIIb on the basis of the second diffusion-weighted raw data $DRD_2$ and the reference image data RBD. The second diffusion coefficients $ADC_2$ result as follows:

$$ADC_2 = -\frac{1}{b2} \cdot \ln\left(\frac{S(b2)}{S(b=0)}\right), \quad (5)$$

where $S(b2)$ represents the signal intensities of the second diffusion-weighted image data $DBD_2$.

The first and second diffusion coefficients $ADC_1$ and $ADC_2$ are then compared image point-by-image point in step 5.IV. The comparison can in turn comprise, for example, the formation of a quotient $Q=ADC_1/ADC_2$ or a difference $D=ADC_1 \ ADC_2$. The extent of the existing anomaly or deviation from a Gaussian diffusion can then be determined, for example, using the extent of the deviation of the quotient Q from the value 1 or the deviation of the difference D from the value 0.

Finally, the results of the comparison are shown on a graph in step 5.V. For example, regions in which a deviation or an anomaly exceeds a minimum are marked in color or with contours against the background of an image recorded without diffusion weighting. A threshold value SW, for example, can be defined for this purpose. The overlaying of masked or unmasked anomaly maps and clinical routine or diffusion images makes anatomical orientation possible for the user.

FIG. 6 shows a flow diagram 600 which illustrates a method for determining a deviation of diffusion-weighted magnetic resonance image data of an examination object from normal diffusion behavior according to a fourth exemplary embodiment of the invention. The fourth exemplary embodiment differs from the previous exemplary embodiments to the extent that now more than two different interval durations are taken into account. Raw data relating to three approximately identical b-values b1, b2 and b3 are recorded in the example shown in FIG. 6.

First diffusion-weighted raw data $DRD_1$ are acquired first of all in step 6.Ia with a first pulse sequence having a first diffusion-encoding gradient pulse sub-sequence $GD_1$ with first time interval parameter values $\delta_1$, $\Delta_1$.

Second diffusion-weighted raw data $DRD_2$ are additionally acquired in step 6.Ib with a second pulse sequence having a second diffusion-encoding gradient pulse sub-sequence $GD_2$ and second time interval parameter values $\delta_2$, $\Delta_2$, which differ quantitatively from the first time interval parameter values $\delta_1$, $\Delta_1$ at least in respect of one of the parameters $\delta$, $\Delta$.

Third diffusion-weighted raw data $DRD_3$ are then additionally acquired in step 6.Ic with a third diffusion-encoding gradient pulse sub-sequence $GD_3$ having third time interval parameter values $\delta_3$, $\Delta_3$.

First to third diffusion-weighted image data $DBD_1$, $DBD_2$, $DBD_3$ is then reconstructed in steps 6.IIa, 6.IIb and 6.IIc. In contrast to the previous exemplary embodiments, model-free statistical parameters are then used, however, in step 6.III instead of the division images or subtraction images to describe the anomaly of the diffusion behavior. For example, a maximum difference $D_{max}=\max(S_k-S_n)$ can be determined for k, n=1, . . . , 3 or a maximum quotient $Q_{max}=\max(S_k/S_n)$ for k, n=1, ..., 3 from the first to third signal intensities $S_1$, $S_2$, $S_3$ of the reconstructed first to third diffusion-weighted image data $DBD_1$, $DBD_2$, $DBD_3$, and be evaluated as a measure of the anomaly of the diffusion behavior in the region to be examined. As already mentioned, the standard deviation of the determined comparative values or the breadth of the distribution of the determined comparative values can also be used as alternative statistical parameters.

Finally, the results of the comparison are shown in a graph in step 6.IV as in conjunction with the other exemplary embodiments, using the statistical parameter, such as, for example, the maximum difference $D_{max}$ or the maximum quotient $Q_{max}$.

FIG. 7 illustrates highly schematically an inventive magnetic resonance system 1 (hereinafter called "MR system" for short). It has the actual magnetic resonance scanner 2 having an examination space 3 or patient tunnel into which an examination object O, or here a patient or test person, in whose body the examination object, for example a specific organ, is located, can be moved on a couch 8.

The magnetic resonance scanner 2 is conventionally fitted with a basic field magnetic system 4, gradient system 6 and an RF transmitting antenna system 5 and an RF receiving antenna system 7. In the illustrated exemplary embodiment the RF transmitting antenna system 5 is a body coil permanently installed in the magnetic resonance scanner 2, whereas the RF receiving antenna system 7 has local coils that are to be arranged on the patient or test person (symbolized by just a single local coil in FIG. 7). Basically, however, the body coil can also be used as an RF receiving antenna system and the local coils as an RF transmitting antenna system if these coils can each be switched into different operating modes.

The MR system 1 also has a central controller 13 used for controlling the MR system 1. This central controller 13 has a sequence controller 14 for pulse sequence control. The sequence of radio-frequency pulses (RF pulses) and gradient pulses is controlled by the sequence controller 14 as a function of a chosen imaging sequence. An imaging sequence of this kind can be specified, for example, within a scanning or control protocol. Different control protocols for different scans are conventionally stored in a storage device 19 and can be chosen by an operator (and optionally changed, if required) and then be used to carry out the scan.

For emitting the individual RF pulses, the central controller 13 has a radio-frequency transmitter 15 that generates and amplifies the RF pulses and feeds them via a suitable interface (not shown) into the RF transmitting antenna system 5. The controller 13 has a gradient system interface 16 for controlling the gradient coils of the gradient system 6. The sequence controller 14 communicates appropriately, e.g. by emitting sequence control data SD, with the radio-frequency transmitter 15 and gradient system interface 16 in order to emit the pulse sequences. The controller 13 also has a radio-frequency receiver 17 (likewise communicating appropriately with the sequence controller 14), in order to acquire magnetic resonance signals, i.e. raw data, received in a coordinated manner from the RF transmitting antenna system 7. A reconstruction processor 18 takes over the acquired raw data and reconstructs the MR image data therefrom. This image data can then be stored, for example, in a memory 19 and/or be processed further in an image data processor 20 in order, for example, to generate other image data and/or parameter maps from different image data, which can in turn likewise be stored in the memory 19. This image data processor 20 has an image data interface 11 for taking over first image data $DBD_1$ which were reconstructed by the reconstruction processor 18 on the basis of first raw data $DRD_1$ acquired with a first gradient pulse sub-sequence $GD_1$, and for taking over second image data $DBD_2$ which was reconstructed on the basis of second raw data $DRD_2$ acquired with a second gradient pulse sub-sequence $GD_2$. In a comparison unit 12 image regions in which there is an anomaly of diffusion behavior are then determined—as already described—on the basis of the first image data $DBD_1$ and second image data $DBD_2$ image.

The anomaly map data resulting from the comparison can be output again, for example stored in the storage device 19, by way of the image data interface 11. Alternatively the image data processing unit 20, in particular the comparator 12, can also be integrated in the reconstruction processor 18 here or be connected externally over a network or the like to the central controller 13.

The central controller 13 can be controlled via a terminal having an input unit 10 and a display unit 9, at which terminal the entire MR system 1 can therefore also be operated by one operator. MR images can also be displayed on the display unit 9, and the input unit 10, optionally in combination with the display unit 9, scans can be planned and started and, in particular, suitable control protocols with suitable scanning sequences can be chosen, as described above, and optionally be modified.

The inventive MR system 1, and in particular the controller 13, can have a number of further components, not illustrated in detail herein but conventionally present in devices of this kind, such as, for example a network interface to connect the entire system to a network and to be able to exchange raw data and/or image data or parameter maps, but also further data such as, for example, patient-relevant data or control protocols.

Those skilled in the art knows how suitable raw data can be acquired and MR images reconstructed therefrom by radiating RF pulses and generating gradient fields, so this need not be described in more detail herein. Similarly, a wide variety of scanning sequences, such as, e.g. EPI scanning sequences or scanning sequences for generating diffusion-weighted images, are known in principle to those skilled in the art.

As mentioned, the method for determining a deviation of diffusion-weighted magnetic resonance image data of an examination object from normal diffusion behavior is not limited to diffusion-weighted imaging with the use of a Stejskal-Tanner sequence.

Furthermore, the described method is not limited to medical applications. Use of the term "unit" herein does not preclude the described item from being composed of components which can optionally also be spatially distributed.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining a deviation of diffusion-weighted magnetic resonance (MR) image data of an examination object from Gaussian diffusion behavior, comprising:
   operating an MR data acquisition scanner to acquire first diffusion-encoded raw data by executing a first diffusion-encoding gradient pulse sub-sequence;
   operating said MR data acquisition scanner to acquire at least second diffusion-encoded raw data by executing at least one second diffusion-encoding gradient pulse sub-sequence, each of said first and second diffusion-encoding gradient pulse sub-sequence comprising at least one parameter that determines a sub-sequence characteristic as a function of time, and wherein said at least one parameter is changed during the acquisition of said at least second diffusion-encoding raw data relative to that parameter during acquisition of said first diffusion-encoded raw data;

in a processor, reconstructing first diffusion-encoded image data from said first diffusion-encoded raw data and reconstructing at least second diffusion-encoded image data from said at least second diffusion-encoded raw data;

in said processor, comparing said first diffusion-encoded image data and said at least second diffusion-encoded image data to obtain a comparison result; and in said processor, making a model-free determination, based on said comparison result, of a deviation, of at least one of said first diffusion-encoded image data or said at least second diffusion-encoded image data, from Gaussian diffusion behavior, and making an electronic designation of said deviation available as an output from said processor.

2. A method as claimed in claim 1 comprising comparing said first diffusion-encoded image data and said at least second diffusion-encoded image data to obtain said comparison result as a comparative value of respective image intensities of said first diffusion-encoded image data and said at least second diffusion-encoded image data, and determining said deviation dependent on a size of said comparative value.

3. A method as claimed in claim 1 comprising comparing said first diffusion-weighted image data and said at least second diffusion-weighted image data to obtain said comparison result as a comparative value selected from the group consisting of a difference of respective image intensities of said first diffusion-encoded image data and said at least second diffusion-encoded image data, and a quotient of respective image intensities of said first diffusion-encoded image data and said at least second diffusion-encoded image data.

4. A method as claimed in claim 1 comprising reconstructing each of said first diffusion-encoded image data and said at least second diffusion-encoded image data to depict diffusion in a single defined direction of a diffusion gradient used to acquire said first diffusion-encoded raw data and said at least second diffusion-encoded raw data.

5. A method as claimed in claim 1 comprising, in said processor, deriving a first tensor parameter from a diffusion tensor represented by said first diffusion-encoded image data, and deriving a second tensor parameter from a diffusion tensor represented by said at least second diffusion-encoded image data, and implementing said comparison as a comparison of said first and second tensor parameters to obtain a tensor parameter comparison result, and determining said deviation from Gaussian diffusion behavior from said tensor parameter comparison result.

6. A method as claimed in claim 5 comprising:
operating said MR data acquisition scanner to acquire reference raw data by executing a reference scanning sequence;
in said processor, determining said first tensor parameter from said first diffusion-encoded raw data and said reference raw data; and
determining said at least second tensor parameter from said at least second diffusion-encoded raw data and said reference raw data.

7. A method as claimed in claim 5 comprising determining each of said first and at least second tensor parameters as a parameter selected from the group consisting of an apparent diffusion coefficient (ADC), fractional anisotropy, and relative anisotropy.

8. A method as claimed in claim 1 comprising reconstructing each of said first diffusion-encoded image data and said at least second diffusion-encoded image data as track-weighted image data comprising diffusion information depicted in three defined directions.

9. A method as claimed in claim 5 comprising:
operating said MR data acquisition scanner to acquire reference raw data by executing a reference scanning sequence;
in said processor, determining said first tensor parameter from said first diffusion-encoded raw data and said reference raw data;
determining said at least second tensor parameter from said at least second diffusion-encoded raw data and said reference raw data;
operating said MR data acquisition scanner to acquire at least third raw data with or without diffusion-weighting; and
in said processor, determining each of said first and second tensor parameters using said first and said at least second raw data, said third raw data and said reference data using a repression method.

10. A method as claimed in claim 1 comprising:
operating said MR data acquisition scanner to acquire third raw data using a third raw data acquisition parameter, which determines said characteristic, that is changed compared to the parameters respectively used for acquiring said first diffusion-weighted raw data and said at least second diffusion-weighted raw data, and generating said comparison result as a comparative value representing a model-free statistical parameter.

11. A method for depicting distribution of a deviation from Gaussian diffusion behavior in a field of view of an examination object, comprising:
operating an MR data acquisition scanner to acquire first diffusion-encoded raw data by executing a first diffusion-encoding gradient pulse sub-sequence;
operating said MR data acquisition scanner to acquire at least second diffusion-encoded raw data by executing at least one second diffusion-encoding gradient pulse sub-sequence, each of said first and second diffusion-encoding gradient pulse sub-sequence comprising at least one parameter that determines a sub-sequence characteristic as a function of time, and wherein said at least one parameter is changed during the acquisition of said at least second diffusion-encoding raw data relative to that parameter during acquisition of said first diffusion-encoded raw data;
in a processor, reconstructing first diffusion-encoded image data from said first diffusion-encoded raw data and reconstructing at least second diffusion-encoded image data from said at least second diffusion-encoded raw data;
in said processor, comparing said first diffusion-encoded image data and said at least second diffusion-encoded image data to obtain a comparison result;
in said processor, generating a map of a spatial distribution of said deviation in the field of view of the examination object; and
at a display in communication with said processor, displaying said map.

12. A controller for a magnetic resonance (MR) apparatus, said controller comprising:
an input configured to receive first diffusion-encoded raw data acquired by executing a first diffusion-encoding gradient pulse sub-sequence with an MR data acquisition scanner;
said input being configured to also receive at least second diffusion-encoded raw data acquired by executing at least one second diffusion-encoding gradient pulse sub-sequence with said MR data acquisition scanner, each of said first and second diffusion-encoding gradient pulse sub-sequence comprising at least one parameter that determines a sub-sequence characteristic as a function of time, and wherein said at least one parameter is changed during the acquisition of said at least second diffusion-encoding raw data relative to that parameter during acquisition of said first diffusion-encoded raw data;
a processor configured to reconstruct first diffusion-encoded image data from said first diffusion-encoded raw data and to reconstruct at least second diffusion-encoded image data from said at least second diffusion-encoded raw data;
said processor being configured to compare said first diffusion-encoded image data and said at least second diffusion-encoded image data to obtain a comparison result; and
said processor being configured to make a model-free determination, based on said comparison result, of a deviation, of at least one of said first diffusion-encoded image data or said at least second diffusion-encoded image data, from Gaussian diffusion behavior, and to make an electronic designation of said deviation available as an output from said processor.

13. A magnetic resonance (MR) apparatus comprising:
an MR data acquisition scanner;
a control computer configured to operate said MR data acquisition scanner to acquire first diffusion-encoded raw data by executing a first diffusion-encoding gradient pulse sub-sequence;
said control computer being configured to operate said MR data acquisition scanner to acquire at least second diffusion-encoded raw data by executing at least one second diffusion-encoding gradient pulse sub-sequence, each of said first and second diffusion-encoding gradient pulse sub-sequence comprising at least one parameter that determines a sub-sequence characteristic as a function of time, and wherein said at least one parameter is changed during the acquisition of said at least second diffusion-encoding raw data relative to that parameter during acquisition of said first diffusion-encoded raw data;
a processor configured to reconstruct first diffusion-encoded image data from said first diffusion-encoded raw data and to reconstruct at least second diffusion-encoded image data from said at least second diffusion-encoded raw data;
said processor being configured to compare said first diffusion-encoded image data and said at least second diffusion-encoded image data to obtain a comparison result; and
said processor being configured to make a model-free determination, based on said comparison result, of a deviation, of at least one of said first diffusion-encoded image data or said at least second diffusion-encoded image data, from Gaussian diffusion behavior, and to make an electronic designation of said deviation available as an output from said processor.

14. A non-transitory, computer-readable data storage medium encoded with programming instructions, said storage medium being loaded into a computer system of a magnetic resonance (MR) apparatus that comprises an MR data acquisition scanner, said programming instructions causing said computer system to:
receive first diffusion-encoded raw data acquired by executing a first diffusion-encoding gradient pulse sub-sequence with an MR data acquisition scanner;
receive at least second diffusion-encoded raw data acquired by executing at least one second diffusion-encoding gradient pulse sub-sequence with said MR data acquisition scanner, each of said first and second diffusion-encoding gradient pulse sub-sequence comprising at least one parameter that determines a sub-sequence characteristic as a function of time, and wherein said at least one parameter is changed during the acquisition of said at least second diffusion-encoding raw data relative to that parameter during acquisition of said first diffusion-encoded raw data;
reconstruct first diffusion-encoded image data from said first diffusion-encoded raw data and reconstruct at least second diffusion-encoded image data from said at least second diffusion-encoded raw data;
compare said first diffusion-encoded image data and said at least second diffusion-encoded image data to obtain a comparison result; and
make a model-free determination, based on said comparison result, of a deviation, of at least one of said first diffusion-encoded image data or said at least second diffusion-encoded image data, from Gaussian diffusion behavior, and make an electronic designation of said deviation available as an output from said computer system.

* * * * *